United States Patent [19]

Nishino

[11] Patent Number: 5,343,075
[45] Date of Patent: Aug. 30, 1994

[54] COMPOSITE STACKED SEMICONDUCTOR DEVICE WITH CONTACT PLATES

[75] Inventor: Tomoki Nishino, Kanagawa, Japan
[73] Assignee: Sony Corporation, Japan
[21] Appl. No.: 901,846
[22] Filed: Jun. 22, 1992
[30] Foreign Application Priority Data
  Jun. 29, 1991 [JP] Japan ............... 3-185626
[51] Int. Cl.⁵ ........................... H01L 23/02
[52] U.S. Cl. ........................ 257/686; 257/696; 257/712; 257/723; 361/744
[58] Field of Search .......... 257/686, 723, 712, 685, 257/686, 712, 723, 696, 677, 685, 686, 712, 723; 361/688, 698, 744

[56] References Cited

U.S. PATENT DOCUMENTS

| | | | |
|---|---|---|---|
| 5,016,138 | 5/1991 | Woodman | 257/686 |
| 5,043,794 | 8/1991 | Tai et al. | 257/687 |
| 5,051,865 | 9/1991 | Kato | 257/712 |
| 5,198,888 | 3/1993 | Sugano et al. | 257/685 |
| 5,281,852 | 1/1994 | Normington | 257/686 |

Primary Examiner—William Mintel
Assistant Examiner—Roy Potter
Attorney, Agent, or Firm—Ronald P. Kananen

[57] ABSTRACT

A composite semiconductor device comprises a multilayer wiring board, a plurality of resin-sealed semiconductor devices having external leads projecting from the opposite sides thereof and stacked one on another, on a multilayer wiring board, and contact plates provided with wiring lines on the inner surfaces thereof and disposed close to the opposite sides of the resin-sealed semiconductor devices, respectively, with the wiring lines in electrical contact with the external leads of the resin-sealed semiconductor devices, respectively. Since the resin-sealed semiconductor devices are stacked, the degree of integration of the resin-sealed semiconductor devices is multiplied by the number of the resin-sealed semiconductor devices so stacked. Since the resin-sealed semiconductor devices are electrically interconnected by the wiring lines of the contact plates, the multilayer wiring board need not be provided with any wiring for electrically interconnecting the resin-sealed semiconductor devices.

6 Claims, 2 Drawing Sheets

COMPOSITE STACKED SEMICONDUCTOR DEVICE WITH CONTACT PLATES

BACKGROUND OF THE INVENTION

1. Field of the Invention

The present invention relates to a composite semiconductor device and, more specifically, to an integral, composite semiconductor device comprising a plurality of resin-sealed semiconductor devices.

2. Description of the Prior Art

In prior art composite semiconductor devices, resin-sealed semiconductor devices are mounted in a planar arrangement on a multilayer wiring board, which is generally referred to as a mother board. In such prior art composite semiconductor devices, the ratio of the area occupied by lead lines which extend from the resin-sealed semiconductor devices to the entire area of the multilayer wiring board has a tendency to increase as the number of semiconductor devices increases. This tendency is enhanced by the increase in the number of bits of the data bus, because the number of data lines increases as the number of bits of the data bus increases, and the number of address lines increases as the memory capacity increases. On the other hand, apparatus in which resin-sealed semiconductor devices are used, are generally required to be of small size and hence the resin-sealed semiconductor devices must enable high-density wiring.

Accordingly, with conventional prior art devices the width of wiring lines of the wiring film must be reduced, which restricts improvement in the operating speed and noise resistance of the circuits.

SUMMARY OF THE INVENTION

The present invention is designed to solve such problems and it is therefore an object of the present invention to provide a composite semiconductor device capable of increasing the degree of integration of the integrated circuit, of reducing the size of a wiring board on which semiconductor devices are to be mounted and of reducing the density of the wiring lines of the wiring board.

In one aspect of the present invention, a composite semiconductor device is provided which comprises: a multilayer wiring board; a plurality of resin-sealed semiconductor devices having external leads projecting from the opposite sides thereof and stacked one on another on the multilayer wiring board; and contact plates provided with wiring lines on the inner surfaces thereof and disposed close to the opposite sides of the resin-sealed semiconductor devices, respectively, with the wiring lines in electrical contact with the external leads of the resin-sealed semiconductor devices.

Since the composite semiconductor device is provided with the plurality of resin-sealed semiconductor devices stacked one on another and the external electrodes of the resin-sealed semiconductor devices are connected to the wiring lines of the contact plates disposed close to the opposite sides of the resin-sealed semiconductor devices, the degree of integration of the resin-sealed semiconductor devices is multiplied by the number of the resin-sealed semiconductor devices. If the resin-sealed semiconductor devices are storage devices, the storage capacity of the composite semiconductor device can be multiplied by the number of the resin-sealed semiconductor devices without increasing the size of the multilayer wiring board.

Furthermore, since the resin-sealed semiconductor devices are electrically interconnected by the wiring lines of the contact plates, the multilayer wiring board need not be provided with any wiring for electrically interconnecting the resin-sealed semiconductor devices. Accordingly, the multilayer wiring board may be of a relatively small size, the wiring lines of the multilayer wiring board can be arranged in a relatively low density and has a relatively small length.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

First Embodiment

Figure 1A:
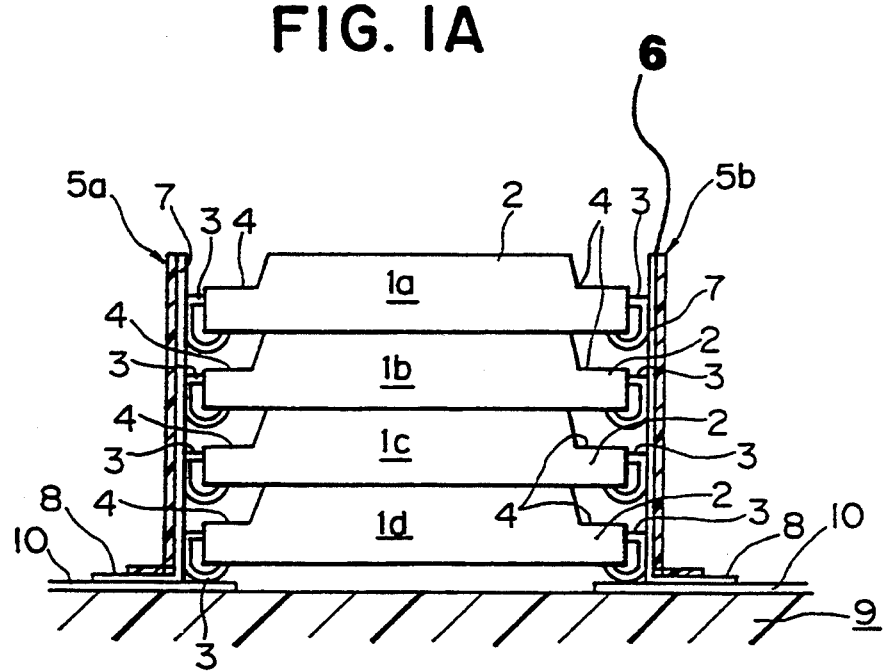
FIGS. 1(A) and 1(B) are a sectional view and an exploded perspective view, respectively, of a composite semiconductor device according to a first embodiment of the present invention.
Figure 1B:
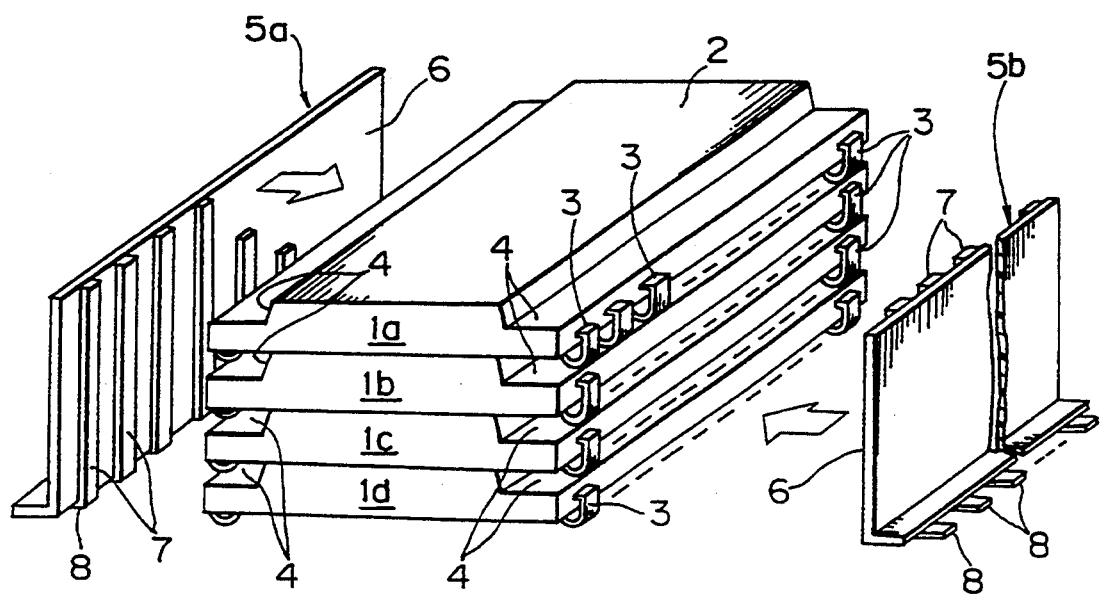

Referring to FIGS. 1A and 1B, resin-sealed semiconductor devices 1a, 1b, 1c and 1d, such as storage devices, are stacked on a multilayer wiring board 9, i.e., a mother board. External leads 3 project from the respective opposite side surfaces of resin packages 2 containing the resin-sealed semiconductor devices 1a, 1b, 1c and 1d. Each external lead preferably bent into a shape resembling the letter J which the projecting extremity thereof extending beneath the lower surface of the corresponding resin package 2. Each of the resin packages 2 the resin-sealed semiconductor devices 1a, 1b, 1c and 1d preferably has opposite side portions 4 of reduced thickness relative to the middle portion of the device. The difference between the thickness of the middle portion of each resin package 2 and that of the reduced thickness side portions 4 is preferably larger than the amount by which the projecting end portion of the J-shaped leads 3 project below the lower surface of the resin package 2. Accordingly, the resin packages 2, each of which contains one of the resin-sealed semiconductor devices 1a, 1b, 1c and 1d, can be stacked with the upper surface of each resin package in contact with the lower surface of the resin package stacked thereon even through the end portions of the J-shaped leads 3 project below the lower surfaces of the resin packages. Adjacent resin packages are preferably adhesively fixed to each other by an adhesive, such as an epoxy adhesive.

Each of contact plates 5a and 5b includes a base plate 6, such as a glass-fiber reinforced epoxy resin plate, and wiring lines 7 formed on one major surface of the base plate 6. The lower ends of the wiring lines 7 may preferably be bent outward (or inward) to form the external terminals 8 of the composite semiconductor device. The wiring lines 7 of the contact plates 5a and 5b are preferably soldered to the external leads 3 of the stacked resin-sealed semiconductor devices 1a, 1b, 1c and 1d, respectively, to combine the contact plates 5a and 5b and the stacked resin-sealed semiconductor devices 1a, 1b, 1c and 1d.

In this embodiment, all the resin-sealed semiconductor devices 1a, 1b, 1c and 1d are storage devices. The address lines, data I/O lines, control lines and power supply lines of the resin-sealed semiconductor devices 1a, 1b, 1c and 1d may be connected through the external leads 3 to the wiring lines 7. The wiring lines 7 for chip selection may be connected to the external leads 3 and to the chip select lines of the resin-sealed semiconductor devices 1a, 1b, 1c and 1d, respectively, to thereby individually apply chip select signals to the resin-sealed semiconductor devices 1a, 1b, 1c and 1d.

The composite semiconductor device is mounted on the multilayer wiring board 9, i.e., the mother board, and the external terminals 8, i e., the lower end portions of the wiring lines 7, may be connected to wiring lines 10 (only two which are shown in FIG. 1(A)) formed on the surface of the multilayer wiring board 9. The external terminals 8 may be soldered to the wiring lines 10 by reflow soldering or thermocompression bonding.

Thus, as illustrated, the composite semiconductor device in the embodiment of FIGS. 1(A) and 1(B) comprises the four resin-sealed semiconductor devices 1a, 1b, 1c and 1d stacked one on another, and the contact plates 5a and 5b joined to the resin-sealed semiconductor devices 1a, 1b, 1c and 1d and electrically connected to the external leads 3 of the resin-sealed semiconductor devices 1a, 1b, 1c and 1d. Accordingly, the degree of integration of the composite semiconductor device is four times that of a prior art composite semiconductor device provided with four resin sealed semiconductor devices disposed in a planar arrangement. If the resin-sealed semiconductor devices are storage devices, the storage capacity of the composite semiconductor device in illustrated first embodiment is four times that of a composite semiconductor device which would occupy the same area as that of the illustrated composite semiconductor device.

Since the stacked resin-sealed semiconductor devices 1a, 1b, 1c and 1d are electrically interconnected by the wiring lines 7 of the contact plates 5a and 5b, the multilayer wiring board 9 need not be provided with any wiring for electrically interconnecting the resin-sealed semiconductor devices 1a, 1b, 1c and 1d. Consequently, the multilayer wiring board 9 on which the composite semiconductor device is mounted may be small as compared with the multi-layer wiring board for mounting a prior art composite semiconductor device of corresponding capacity. Preferably the wiring lines 10 of the multilayer wiring board 9 are formed be of a relatively low density and 10 are relatively short.

Accordingly, the impedance of the signal lines is reduced, noise attributable to changes in the level of the supply potential or that of the ground potential due to the simultaneous ON-and-OFF (HIGH-LOW) action of signals on a plurality of signal lines is reduced, and signal transmission speed is enhanced.

An increase in the capacity and function of an apparatus provided with the composite semiconductor device according to the present invention can be readily achieved by increasing the number of the component resin-sealed semiconductor devices of the composite semiconductor device. To augment the storage capacity of an apparatus provided with a prior art composite semiconductor device, the composite semiconductor device must be replaced with a new composite semiconductor device having a multilayer wiring board of an area greater than that of the multilayer wiring board of the former composite semiconductor device and provided with additional wiring lines. On the other hand, the storage capacity of an apparatus provided with the composite semiconductor device according to the present invention can be readily augmented by providing the composite semiconductor device with additional resin-sealed semiconductor devices, and hence the multilayer wiring board need not necessarily be replaced with a multilayer wiring board of a new design.

Second Embodiment

Figure 2:
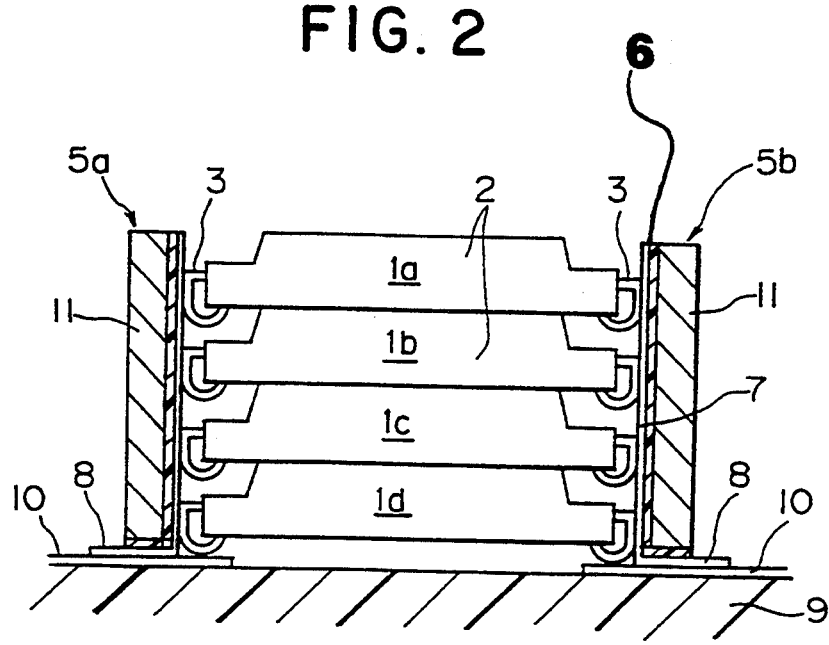
FIG. 2 is a sectional view of a composite semiconductor device according to a second embodiment of to the present invention.

Referring to FIG. 2, a composite semiconductor device of a second embodiment of to the present invention is illustrated which is similar in construction to the composite semiconductor device of the first embodiment (FIGS. 1(A) and 1(B), except that the composite semiconductor device in the second embodiment employs contact plates 5a and 5b each having a base plate 6 provided on its outer surfaces, i.e., on the surface opposite to the surface on which wiring lines are formed, with heat-radiating plates 11 made, for example, of an aluminum alloy to thereby enhance the heat-radiating performance of the composite semiconductor device. The heat-radiating plates 11 are preferably attached adhesively to the outer surfaces of the base plates 6.

Third Embodiment

Figure 3:
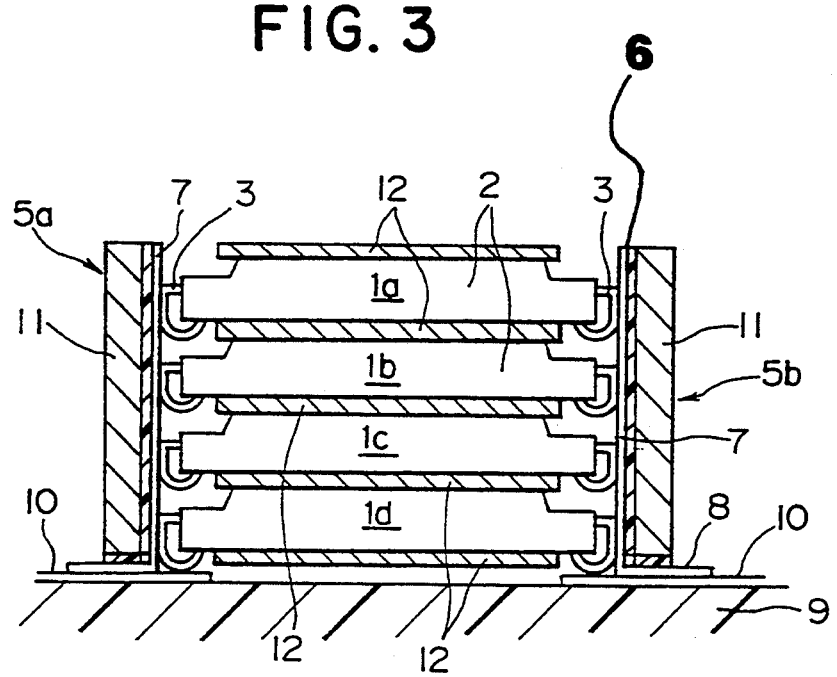
FIG. 3 is a sectional view of a composite semiconductor device according to a third embodiment of the present invention.

Referring to FIG. 3, there is depicted a composite semiconductor device according to a third embodiment of the present invention which is similar in construction to the composite semiconductor device depicted in connection with the second embodiment (FIG. 2), except that the composite semiconductor device in the third embodiment is designed to further enhance heat-radiating performance as compared with the second embodiment .

The composite semiconductor device according to the third embodiment of the invention is provided with heat-radiating plates 12 positioned between adjacent resin-sealed semiconductor devices 1a, 1b, 1c and 1d, a heat-radiating plate 12 attached to the lower surface of the lowermost resin-sealed semiconductor device 1d, and a heat-radiating plate 12 attached to the upper surface of the uppermost resin-sealed semiconductor device 1a, in addition the heat-radiating plates 11 attached to the outer surfaces of the base plates 6 of contact plates 5a and 5b.

Each of the contact plates 5a and 5b of each of the composite semiconductor devices shown in FIGS. 2 and 3 is preferably fabricated by forming wiring lines 7 of a thin copper film plated with solder or the like on the surface of a thin base plate 6, such as a glass-fiber reinforced epoxy resin plate, and attaching the base plate 6 to the heat-radiating plate 11 by brazing. The lower portions of the base plates 6 are preferably bent outward along the lower edge of the heat-radiating plate 11.

Some of the wiring lines 7 are for electrically interconnecting the external leads 3 of the resin-sealed semiconductor devices 1a, 1b, 1c and 1d; some of the wiring lines 7 are for electrically connecting the resin-sealed semiconductor device 1a, 1b, 1c or 1d to the external terminal 8 of the composite semiconductor device, and the rest of the wiring lines 7 are for electrically interconnecting the external leads 3 and electrically connecting the external leads 3 to the external terminals 8 of the composite semiconductor device connected to external devices.

Accordingly, the wiring lines 7 which electrically interconnect the resin-sealed semiconductor devices 1a, 1b, 1c and 1d need not be electrically connected to external devices. These wiring lines 7 need not be provided with external terminals 8.

As a modification, it is possible to pair the resin-sealed semiconductor devices 1a, 1b, 1c and 1d into, for example, the pair comprising resin-sealed semiconductor devices 1a and 1b, and the pair comprising resin-sealed semiconductor devices, 1c and 1d, and to commonly connect the address lines and the data I/O lines of each of the pairs of resin-sealed semiconductor devices, 1a and 1b, and 1c and 1d, respectively, to the wiring lines 7, of the contact plates 5a and 5b, without electrically interconnecting the pair of resin-sealed semiconductor devices 1a and 1b, or the pair of resin-sealed semiconductor devices 1c and 1b, to each other.

The external leads 3 need not necessarily be bent in the shape resembling the letter J; the external leads 3 may be bent up or down so that the extremity thereof will not project beyond planes which include the upper and lower surfaces of the associated resin-sealed semiconductor device. When the external leads 3 are bent in such a shape, the resin package 2 need not necessarily be provided with the reduced side portions.

The wiring lines 7 of the contact plates 5a and 5b may be formed in a desired pattern and the external leads 3 of the resin-sealed semiconductor devices 1a, 1b, 1c and 1d of the composite semiconductor device of the present invention and the wiring lines 7 may be interconnected in a desired wiring connection to form a desired circuit.

Although the invention has been described in its preferred forms with a certain degree of particularity, obviously many changes and variations are possible therein. It is therefore to be understood that the present invention may be practiced otherwise than as specifically described herein without departing from the spirit and scope thereof.

What is claimed is:

1. A composite semiconductor device comprising:
   a wiring board;
   a plurality of resin-sealed semiconductor devices, each contained within a respective resin package and having external leads projecting from opposite sides thereof, said resin packages being stacked on each other to form a stack, said stack being supported on the wiring board; and
   a pair of contact plates having wiring lines on the inner surfaces thereof and supported on the wiring board, each of said pair of contact plates being positioned proximate to one of the opposite sides of the resin-sealed semiconductor devices of said stack, said contact plates having disposed thereon wiring lines wherein said external leads are formed whereby external leads of the stack of resin-sealed semiconductor devices resiliently contact and form an electrical connection with selected wiring lines of said contact plates.

2. The device according to claim 1, wherein said resin packages have side portions of reduced thickness relative to a center portion thereof whereby when said resin packages are stacked, a space is created between the side portions of adjacent stacked resin packages and wherein said external leads extend from said resin packages into said space and into contact with one of said contact plates.

3. A composite semiconductor device comprising:
   a wiring board,
   a plurality of resin-sealed semiconductor devices, each contained within a respective resin package and having external leads projecting from opposite sides thereof, said resin packages being stacked on each other to form a stack, said stack being supported on the wiring board; and
   a pair of contact plates having wiring lines on the inner surfaces thereof and supported on the wiring board, each of said pair of contact plates being positioned proximate to one of the opposite sides of the resin-sealed semiconductor devices of said stack, said contact plates having disposed thereon wiring lines positioned to form an electrical contact with selected external leads of the stack of resin-sealed semiconductor devices and; wherein a heat-radiating plate is attached to the outer surface of said contact plates.

4. A composite semiconductor device according to claim 3, further comprising heat-radiating plates attached to the upper surface of the resin package of the uppermost resin-sealed semiconductor device and the lower surface of the resin package of the lowermost resin-sealed semiconductor device, and heat-radiating plates inserted between the resin packages of the resin-sealed semiconductor devices.

5. A composite semiconductor device according to claim 3 or 4, wherein the heat-radiating plates are formed of an aluminum alloy, and the contact plates are glass-fiber reinforced expoxy resin plates.

6. A composite semiconductor device comprising:
   a wiring board,
   a plurality of resin-sealed semiconductor devices, each contained within a respective resin package and having external leads projecting from opposite sides thereof, said resin packages being stacked on each other to form a stack, said stack being supported on the wiring board; and
   a pair of contact plates having wiring lines on the inner surfaces thereof and supported on the wiring board, each of said pair of contact plates being positioned proximate to one of the opposite sides of the resin-sealed semiconductor devices of said stack, said contact plates having disposed thereon wiring lines positioned to form an electrical contact with selected external leads of the stack of resin-sealed semiconductor devices and; wherein said external leads are J-shaped, having an arcuate portion cojoined with a straight portion, said straight portion being adapted to bear against said contact plates and said arcuate portion being adapted to provide a resilient bias for maintaining said contact.

* * * * *